(12) United States Patent
Usuda et al.

(10) Patent No.: US 7,119,385 B2
(45) Date of Patent: Oct. 10, 2006

(54) SEMICONDUCTOR APPARATUS HAVING FIRST AND SECOND GATE ELECTRODES

(75) Inventors: Koji Usuda, Yokohama (JP); Shinichi Takagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 10/913,478

(22) Filed: Aug. 9, 2004

(65) Prior Publication Data

US 2005/0009282 A1   Jan. 13, 2005

Related U.S. Application Data

(62) Division of application No. 10/627,648, filed on Jul. 28, 2003, now Pat. No. 6,943,385.

(30) Foreign Application Priority Data

Jul. 29, 2002  (JP)  ............................. 2002-220031

(51) Int. Cl.
  *H01L 27/148*  (2006.01)
  *H01L 29/768*  (2006.01)
(52) U.S. Cl. .................. 257/250; 257/278; 257/347
(58) Field of Classification Search ................ 257/250, 257/278, 347
See application file for complete search history.

(56) References Cited

U.S. PATENT DOCUMENTS 4,907,053 A * 3/1990 Ohmi ......................... 257/315
5,461,250 A * 10/1995 Burghartz et al. .......... 257/347
2003/0139027 A1 * 7/2003 Ikeda et al. ................ 438/592
2005/0158933 A1 * 7/2005 Inoh ........................... 438/197

FOREIGN PATENT DOCUMENTS

| JP | 11-121695 | 4/1999 |
| JP | 2003-234472 | 8/2003 |
| KR | 1999-0037030 | 5/1999 |

OTHER PUBLICATIONS

V. A. Rozhkov et al., "Electrical Breakdown of Rare Earth Oxide Insulator Thin Films in Silicon MIS Structures," 1995 IEEE 5th International Conference on Conduction and Breakdown in Solid Dielectrics, pp. 418-422.

Copy of Korean Office Action mailed by the Korean Patent Office on May 16, 2005, in counterpart Korean Application No. 10-2003-0051931.

(Continued)

*Primary Examiner*—Phat X. Cao
(74) *Attorney, Agent, or Firm*—Finnegan, Henderson, Farabow, Garrett & Dunner, L.L.P.

(57) ABSTRACT

A semiconductor apparatus includes a substrate, a buffer layer made of a monocrystal semiconductor material and formed on the substrate, a strained-Si layer formed on the buffer layer and having a lattice constant different from that of the buffer layer, a monocrystal insulating film formed on the strained-Si layer and made of a material having a rare earth structure with a lattice constant different from that of Si, and an electrode formed on the insulating film.

7 Claims, 4 Drawing Sheets

OTHER PUBLICATIONS

McKee et al. "Physical Structure and Inversion Charge at a Semiconductor Interface with a Crystalline Oxide", Science, vol. 293, pp. 468-471, (2001).

Nishikawa et al., "Direct Growth of Single Crystalline $CeO_2$ High-K Gate Dielectrics", Extended Abstracts of the 2001 International Conference on Solid State Devices and Materials, pp. 174-175, (2001).

Gottschalk et al., "Epitaxial $Pr_2O_3$ on Silicon as an Alternative Gate Oxide for Future CMOS Applications", Joint Session Crystalline Oxides for Gate Dielectrics, Session N8.5/T6.5, pp. 350-351, (2002).

Tezuka et al., "Novel Fully-Depleted SiGe-on-Insulator pMOSFETs With High-Mobility SiGe Surface Channels", IEDM Tech. Dig., 946, IEEE, (2001).

Welser et al.; "Strain Dependence of the Performance Enhancement in Strained-Si *n*-MOSFETs"; IEDM, pp. 373-376, IEEE, (1994).

Hirose et al.; "Fundamental Limit of Gate Oxide Thickness Scaling in Advanced MOSFETs"; Semicond. Sci. Technol. vol. 15, pp. 485-490, (2000).

Copy of Korean Patent Office Action entitled "Notification of Filing Opinion," mailed by the Korean Patent Office on Feb. 21, 2006 in counterpart Korean Application No. 10-2003-51931.

* cited by examiner

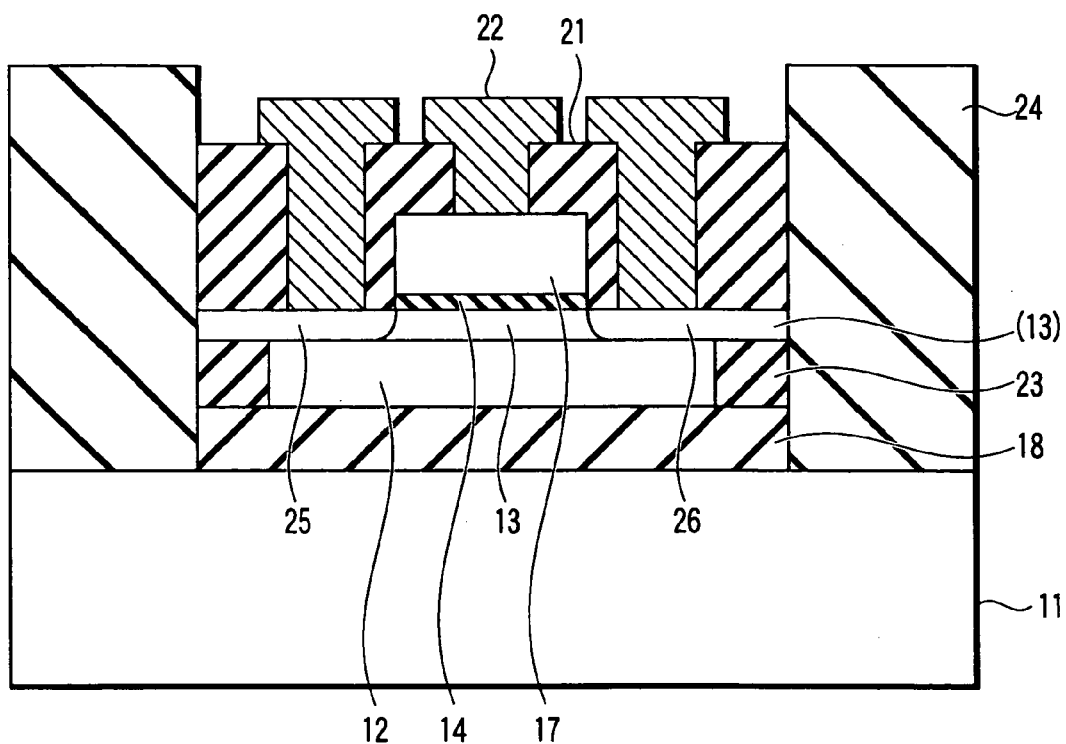
F I G. 5
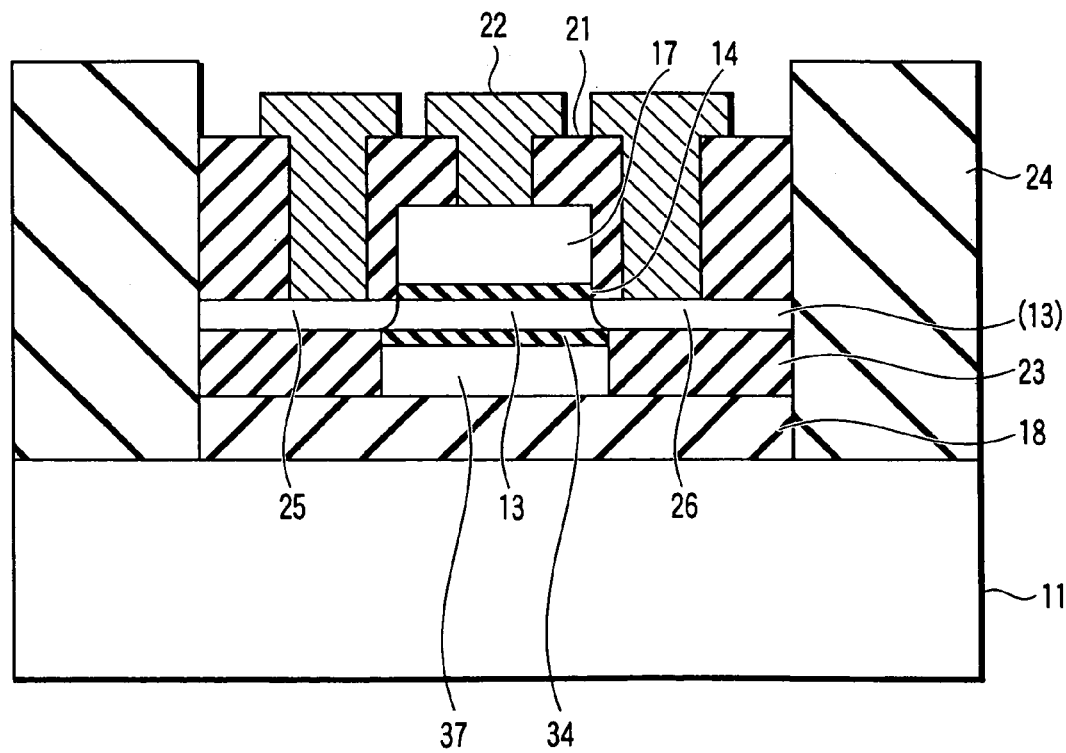
F I G. 7

SEMICONDUCTOR APPARATUS HAVING FIRST AND SECOND GATE ELECTRODES

CROSS-REFERENCE TO RELATED APPLICATIONS

This application is a division of application Ser. No. 10/627,648, filed Jul. 28, 2003, U.S. Pat. No. 6,943,385 which is incorporated in its entirety herein by reference. This application is also based upon and claims priority from prior Japanese Patent Application No. 2002-220031, filed Jul. 29, 2002, the entire contents of which are incorporated by reference.

BACKGROUND OF THE INVENTION

1. Field of the Invention

The present invention relates to a semiconductor apparatus having a strained-Si channel, and more particularly to a semiconductor apparatus having an improved gate insulating film or gate electrode structure.

2. Description of the Related Art

In recent years, as a method of improving electron mobility, which is one of the guidelines of realization of high performance of an Si-MOSFET, a technology which applies a strain to an Si layer has attracted attention. When the strain is applied to the Si layer, its band structure is changed, and scattering of carriers in a channel can be suppressed. Therefore, an improvement in mobility can be expected. Specifically, a compound crystal layer formed of a material having a larger lattice constant than that of Si, e.g., an SiGe compound crystal layer (which will be simply referred to as an SiGe layer hereinafter) having a Ge concentration of 20% is formed on an Si substrate, and an Si layer is formed on this SiGe layer. Then, a strained-Si layer, to which a strain is applied due to a difference in lattice constant, is formed.

It has been reported that a great improvement in the electron mobility which is approximately 1.76 times that of a semiconductor device using a strain-free channel layer can be achieved when such a strained-Si layer is used for a channel of a semiconductor device (J. Welser, J. L. Hoyl, S. Takagi, and J. F. Gibbons, IEDM 94–373).

Further, when realization of a short channel of a MOSFET is advanced in order to improve the electron mobility, the influence of stray capacitance becomes large, and it is difficult to improve the electron mobility as expected. In order to solve this problem, a structure in which the semiconductor channel layer is provided on an SOI (Silicon On Insulator) structure has attracted attention. By introducing this structure, a reduction in stray capacitance or isolation of elements can be facilitated, and realization of a further reduction in power consumption or higher integration can be expected compared with the prior art.

On the other hand, as MOSFETs gradually become minute, in a structure where a gate insulating film/channel layer is formed on a conventional oxide film/Si substrate, it is expected that a limit in realization of minuteness will be reached in 2010 or later years (ITRS Roadmap 2000). Here, as one of the problems which first reach the limit in realization of minuteness as well as a limit in lithography, there is the sudden increase in tunnel leakage current due to a reduction in film thickness beyond several nm, which is against a reduction in power consumption, or the limit in reduction in film thickness of an oxide film that an operation failure due to a deterioration in film quality owing to a reduction in film can be expected.

As a result of an examination concerning an increase in leakage current in an oxide film having a film thickness of 1 nm, a fact that the roadmap of ITRS is adequate has been already demonstrated as actual data (M. Hirose et al., Smicond. Sci. Tecnol. 15,485 (2000)). Therefore, in order to continue realization of minuteness in future and subsequently aim at an improvement in an element characteristic such as offering of sophisticated functions, higher performances, a higher speed and others, an alternative technique of the oxide film as well as an improvement in the channel layer must be developed.

As described above, in a semiconductor device including a strained-Si channel layer in the prior art, although realization of higher performances can be expected as compared with a device in which the channel layer is formed directly on the Si substrate, it is considered that a new technology must be introduced to structures other than the channel layer in the case of aiming at realization of higher performances in future.

Therefore, in a structure using the strained-Si channel layer, there is desired realization of a semi-conductor apparatus which can suppress a deterioration in film quality of a gate insulating film due to realization of minuteness and an increase in leakage current and which can further improve an element characteristic.

BRIEF SUMMARY OF THE INVENTION

According to a first aspect of the present invention, there is provided a semiconductor apparatus comprising:
a substrate;
a buffer layer made of a monocrystal semiconductor material and formed on the substrate;
a strained-Si layer formed on the buffer layer and having a lattice constant different from that of the buffer layer;
a monocrystal insulating film formed on the strained-Si layer, the monocrystal insulating film being made of a material having a rare earth structure with a lattice constant different from that of Si; and
an electrode formed on the insulating film.

Further, according to a second aspect of the present invention, there is provided a semiconductor apparatus comprising:
a substrate;
a buffer layer made of a monocrystal semiconductor material and formed on the substrate;
a strained-silicon layer formed on the buffer layer and having a lattice constant different from that of the buffer layer;
a source region and a drain region formed in the strained-silicon layer so as to be separated from each other;
a gate insulating film formed on the strained-silicon layer sandwiched between the source region and the drain region and made of a monocrystal rare earth oxide having a lattice constant different from that of silicon; and
a gate electrode formed on the gate insulating film.

Furthermore, according to a third aspect of the present invention, there is provided a semiconductor apparatus comprising:
a substrate;
an insulating film formed on the substrate;
a first gate electrode made of a first monocrystal semiconductor material;
a first gate insulating film made of a first monocrystal rare earth oxide and formed on the first gate electrode;
a monocrystal Si layer formed on the first gate insulating film;

a second gate insulating film made of a second monocrystal rare earth oxide and formed at a position opposed to the first gate insulating film on the monocrystal Si layer; and a second gate electrode made of a second monocrystal semiconductor material and formed on the second gate insulating film.

BRIEF DESCRIPTION OF THE SEVERAL VIEWS OF THE DRAWING

FIG. 5 is a cross-sectional view showing an element structure of a semiconductor apparatus according to a fourth embodiment;

FIG. 7 is a cross-sectional view showing an element structure of a semiconductor apparatus according to the fifth embodiment.

DETAILED DESCRIPTION OF THE INVENTION

According to an embodiment which will be described later, an improvement in a mobility can be expected because a strained-Si layer is used for a channel layer, and a crystal insulating layer having a rare earth structure with a lattice constant different from that of a channel layer is used for a gate insulating film. Therefore, a dielectric constant in the gate insulating film can be increased, and an increase in leakage current due to a reduction in film thickness of the gate insulating film involved by realization of minuteness of an element can be suppressed. Accordingly, problems of a limit in realization of a higher speed of the channel layer and a limit in reduction in film thickness of the gate insulating film can be solved at the same time.

Here, in a report about a case that $CeO_2$ is subjected to epitaxial growth on relaxed Si (R. A. McKee et al., Science 293,468 (2001), or Y. Nishikawa et al., Ext. Abstracts, SSDM 2001, 174)), it is found that an insulating film which has an dielectric constant exceeding 10 can be formed, and it is also revealed that a reduction in leakage of more than five digits is possible if EOT (Equivalent Oxide Thickness) is equal to that of a conventional oxide film. In the case of strained Si on the relaxed SiGe, a tensile strain is given to the Si, and a larger tensile strain than that in the case of the relaxed Si is generated in $CeO_2$ formed on Si. Thus, a further effect of an improvement in dielectric constant can be expected.

Moreover, a gate electrode can be formed of a crystal layer on the gate insulating film and, as a result, a channel layer, a gate insulating film and a gate electrode can be continuously formed at a low temperature in some cases. Additionally, a so-called SOI structure is formed by forming the above-described structure on the insulating layer, which is effective for a reduction in power consumption. Therefore, it is possible to realize formation of an element on a substrate with a low melting point such as a glass which cannot be conventionally manufactured and formation of an element in a so-called damascene structure, and a semiconductor element with a high quality and a high performance can be formed with a low cost with the number of manufacturing steps being reduced. Further, a reduction of power consumption of the manufactured element is also enabled.

Embodiments according to the present invention will now be described with reference to the accompanying drawings.

(First Embodiment)

Figure 1:
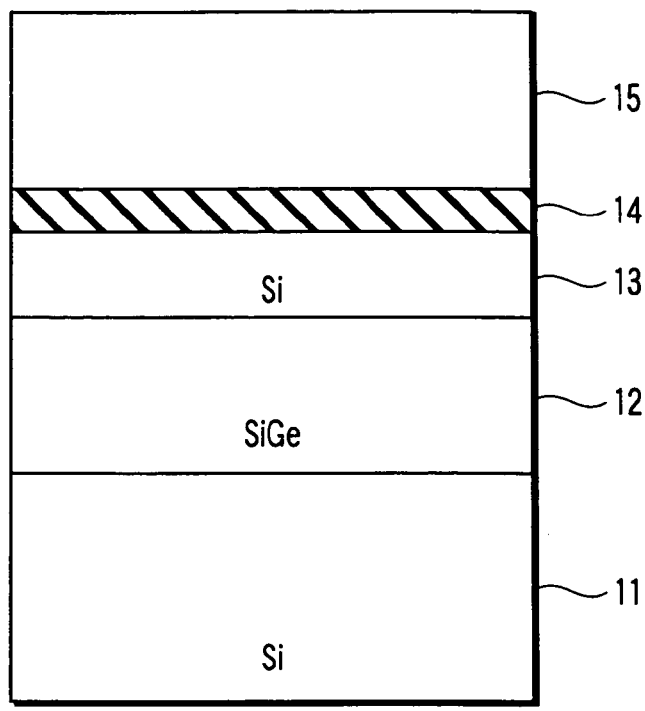
FIG. 1 is a cross-sectional view showing an element structure of a semiconductor apparatus according to a first embodiment.

FIG. 1 is a cross-sectional view showing an element structure of a semiconductor apparatus according to a first embodiment of the present invention.

A monocrystal SiGe layer 12 as a buffer layer is laminated on a monocrystal Si substrate 11. A laminated layer of thin films is usually formed by a CVD (chemical vapor deposition) or MBE (molecular beam epitaxy) process. For example, in the case of forming the SiGe layer by CVD, a source gas of Si and a source gas of Ge are led onto the Si substrate 11 heated to, e.g., 550° C., and the SiGe layer 12 having a thickness of, e.g., 50 nm is formed. At this moment, a Ge composition of the SiGe layer 12 on the front surface side is typically not less than 5% and less than 60% and, preferably not less than 20% and less than 50%.

The SiGe layer 12 can relax a strain caused due to a difference in lattice constant from the underlying Si substrate 11 by, e.g., leading a dislocation in the layer, and must release the strain so that relaxed SiGe can be obtained on the front surface side of the crystal. Therefore, the SiGe layer 12 varies the lattice constant in a direction vertical to the substrate by changing a Ge concentration in a direction of crystal growth vertical to the substrate surface.

Further, the SiGe layer 12 in which strain relax is realized by bonding or a condense method with oxidation process (T. Tezuka et al., IEDM Tech. Dig., 946 (2001)) may be formed on the Si substrate 11. As a result, the SiGe layer 12 can have a function as a stressor which applies a strain to an Si channel layer. It is to be noted that, in the bonding method, a support substrate having the previously-relaxed SiGe layer 12 formed thereto is bonded on the surface of the Si substrate 11 directly or through an oxide film, and then only the relaxed SiGe layer 12 is left by peeling the support substrate having the SiGe layer 12 formed thereto.

A monocrystal Si layer 13 having a thickness of 20 nm which serves as a channel layer of an MOSFET is formed on the relaxed SiGe layer 12. At this moment, a tensile strain is given to the Si layer 13 because of a difference in lattice constant between SiGe and Si. Here, it is good enough that a lattice constant difference on an interface of the SiGe layer/Si layer is not less than $|\Delta d|>0.01\%$, and a range of $|\Delta d|<0.02\%$ to 4% is particularly desirable.

A monocrystal insulting layer 14 having a thickness of 3 nm, e.g., an oxidized cerium ($CeO_2$) film is formed on the strained-Si layer 13 having a tensile strain by using, e.g., a molecular beam epitaxy method. On this $CeO_2$ film 14 is formed a poly-Si layer 15 with a thickness of 200 nm as a gate electrode. Here, the $CeO_2$ film 14 is a film which epitaxially grows on the Si substrate, especially Si (111) surface. It is to be noted that the monocrystal gate insulating film 14 is not restricted to the $CeO_2$ film as long as it is an insulating film which epitaxially grows on the Si substrate, and any other rare earth oxide, e.g., $PrO_2$ can be used. Moreover, a material other than the rare earth oxides can be used.

Additionally, by using a rare earth oxide as typified by the $CeO_2$ film, a dielectric constant of the insulating film becomes not less than 10. When a transistor is manufactured by using this, it is possible to produce a high-performance transistor which can reduce a leakage current and has an effective oxide film thickness (teff) of approximately 1.0 nm.

Figure 2:
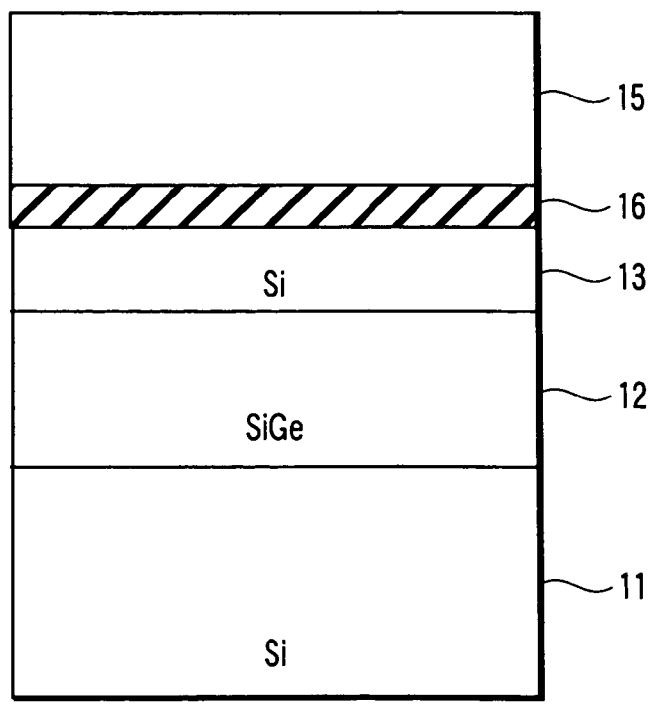
FIG. 2 is a cross-sectional view showing a typical example of a conventional MOSFET structure.

FIG. 2 shows a typical example of a conventional MOS-FET structure for comparison. A difference from FIG. 1 lies in that an amorphous Si oxide film ($SiO_2$) 16 is formed in place of the crystal insulating layer 14. Here, a relative dielectric constant of the $SiO_2$ film 16 is as small as approximately 3.8, and an oxide film thickness must be reduced to a 1 nm order in an element whose latest size is approximately 100 nm×100 nm. As a result, formation of the thin insulating film itself is very difficult. Even if a uniform very thin oxide film which can assure a yield can be formed, an increase in tunnel current is large, and an increase in power consumption in an operation of the element cannot be avoided. Therefore, it is difficult to adopt it as a logical element device.

As described above, according to this embodiment, since the monocrystal $CeO_2$ is used as the gate insulating film 14, a dielectric constant in the gate insulating film 14 can be increased, and it is possible to suppress an increase in leakage current due to a reduction in film thickness of the gate insulating film involved in realization of minuteness of the element. Therefore, it is possible to realize the MOSFET which can operate at a high speed and has a high reliability with an improvement in the mobility due to a use of the strained-Si channel layer as an element formation layer.

(Second Embodiment)

Figure 3:
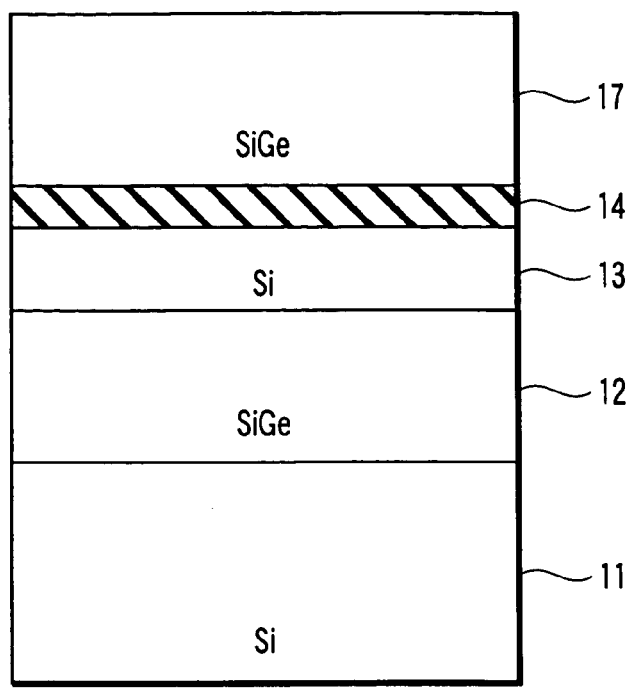
FIG. 3 is a cross-sectional view showing an element structure of a semiconductor apparatus according to a second embodiment.

FIG. 3 is a cross-sectional view showing an element structure of a semiconductor apparatus according to a second embodiment of the present invention. It is to be noted that like reference numerals denote parts equal to those in FIG. 1, thereby eliminating their detailed explanation.

A difference of this embodiment from the first embodiment mentioned above is a use of monocrystal Si or SiGe as a gate electrode 17. In the case of using monocrystal Si as the gate electrode 17 formed on a monocrystal gate insulating film 14, the gate electrode can be formed at a typical low temperature of 500° C. to 700° C. in a temperature range of approximately 400° C. to 1000° C. by utilizing the CDV method or the MBE method using a compound gas such as silane ($SiH_4$), disilane ($Si_2H_6$), dichlorsilane ($SiH_2Cl_2$) or silane tetrachloride ($SiCl_4$) as a source gas. At the time of this crystal growth, impurities can be simultaneously added. B or Sb is added when forming a p type gate electrode, and As or P is added when forming an n type gate electrode.

Further, in the case of using monocrystal SiGe as the gate electrode 17, it is good enough to use a Ge source gas, e.g., a $GeH_4$ gas (germane gas) in addition to the Si source gas. If the gate electrode 17 is formed of SiGe, since a larger tensile strain is given by $CeO_2$ as the gate insulating film 14, this is advantageous for the dielectric constant improving effect.

It is to be noted that, when generally forming the gate electrode, e.g., $4 \times 10^{15}$ $cm^{-2}$ of phosphor must be injected into gate poly-Si by ion implantation, and then activation annealing must be carried out at a temperature of approximately 500° C. to 1100° C., or typically 950° C. for not more than approximately one minute. However, since this annealing process is carried out at a high temperature as described above, a strain relax of the semiconductor layer 13 or generation of a crystal defect occurs, which may possibly deteriorate the device characteristic. On the other hand, this embodiment has a characteristic which can simultaneously realize formation of the gate electrode and activation at a low temperature, and maintenance of the device characteristic and a reduction in process cost by a decrease in the number of steps can be expected.

As described above, according to this embodiment, the monocrystal $CeO_2$ is used as the gate insulating film 14 formed on the strained-Si layer 13 which serves as a channel layer of the MOSFET, and monocrystal Si or SiGe is used as the gate electrode 17. As a result, the same advantages as those of the first embodiment can be obtained, and all the layers from the buffer layer 12 to the gate electrode 17 can be subjected to epitaxial growth in the same chamber. Therefore, the high-quality and high-performance MOSFET can be formed at a low cost realized by a reduction in the number of manufacturing steps.

(Third Embodiment)

Figure 4:
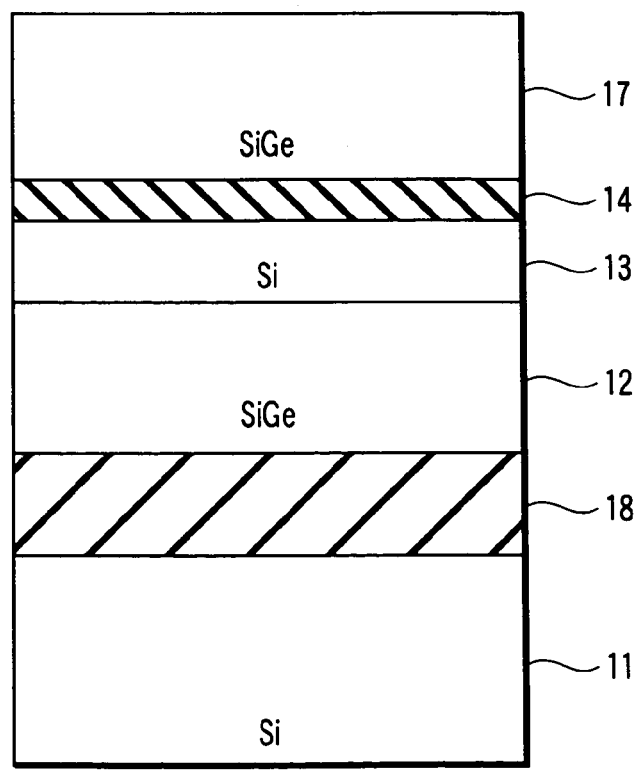
FIG. 4 is a cross-sectional view showing an element structure of a semiconductor apparatus according to a third embodiment.

FIG. 4 is a cross-sectional view showing an element structure of a semiconductor apparatus according to a third embodiment of the present invention. It is to be noted that like reference numerals denote parts equal to those in FIG. 1, thereby eliminating their detailed explanation.

A difference of this embodiment from the second embodiment mentioned above lies in that an $SiO_2$ film as an embedded insulating film 18 is formed between the Si substrate 11 and the SiGe layer 12. This insulating layer 18 can be formed by a method which is usually used, e.g., thermal oxidation for a dry oxide film, a wet oxide film or the like, deposition (CVD), wet oxidation using solution processing, and others.

In FIG. 4, although the $SiO_2$ film is taken as an example, any material which can serve as an insulating film can be adopted, and extensive organic or inorganic materials can be adopted. A condition required in this case is that a stressor layer which applies a strain to the Si layer 13 as a channel, i.e., the SiGe layer in FIG. 4 can be formed on the insulating layer 18. Therefore, the Si substrate 11 is just a support substrate, and its role cannot be prevented as long as it is a material which can resist an element manufacturing process such as a heat history or chemical processing.

When such a structure is adopted, the same advantages as those in the second embodiment can be obtained, and power consumption as a device can be reduced in order that the element formation substrate can have the SOI structure.

(Fourth Embodiment)

FIG. 5 is a cross-sectional view showing an element structure of a semiconductor apparatus according to a fourth embodiment of the present invention. It is to be noted that like reference numerals denote parts equal to those in FIG. 4, thereby eliminating the detailed explanation.

This embodiment basically adopts a structure of the third embodiment and further concretizes this structure. That is, like the third embodiment, the $SiO_2$ film as the insulating layer 18 is formed on the Si substrate 11, the gate insulting film 14 formed of the relaxed SiGe layer 12, the monocrystal strained-Si layer 13 and the monocrystal $CeO_2$ layer and the gate electrode 17 formed of the monocrystal SiGe layer are formed on the $SiO_2$ film, and the gate electrode 17 and the gate insulating film 14 are processed to have gate structures. A source area 25 and a drain area 26 are formed in the strained-silicon layer 13 so as to sandwich the strained-silicon layer 13 immediately below the gate electrode 17.

An interlayer insulating film 21 is formed on the strained-Si layer 13 and the gate electrode 17, and a contact hole is formed in the insulating film 21. Furthermore, aluminium wirings 22 respectively connected to the source area 25, the drain area 26 and the gate electrode 17 are formed on the insulating film 21. It is to be noted that reference numerals 23 and 24 in the drawing denote element isolation insulating films used to isolate the element area.

In this embodiment, since all the layer structures can be formed by epitaxial growth like the third embodiment, although not shown, the element which requires, e.g., a high-temperature process is formed, and thereafter a semiconductor apparatus can be formed in an area completely surrounded by the element isolation insulating film. That is, it is possible to manufacture an embedded type high-performance transistor using CVD.

Figure 6:
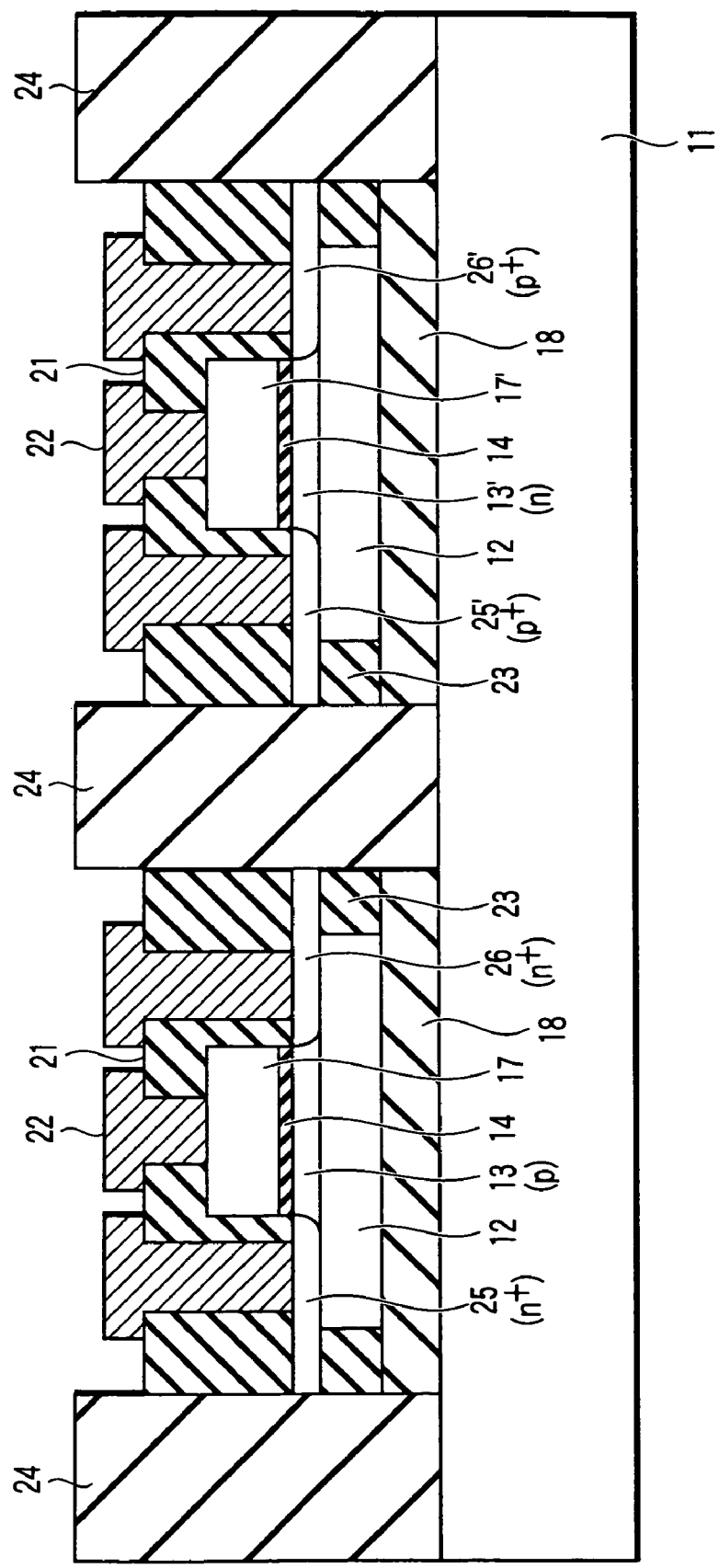
FIG. 6 is a cross-sectional view showing an element structure of a modification of the semiconductor apparatus according to the fourth embodiment.

As shown in FIG. 6, this embodiment can be applied to a CMOS structure. The left side shows an n channel MOSFET, and an n+ type source area 25 and a drain area 26 are formed in a p type strained-silicon layer 13. The gate electrode 17 can be formed by, e.g., n+ type polysilicon. The right side shows a p channel MOSFET, and a p+ type source area 25' and a drain area 26' are formed in an n-type strained-silicon layer 13'. The gate electrode 17' can be formed by, e.g., p+ type polysilicon. Any other parts have the same reference numerals as those in FIG. 5, thereby eliminating the tautological description.

(Fifth Embodiment)

FIG. 7 is a cross-sectional view showing an element structure of a semiconductor apparatus according to a fifth embodiment of the present invention. It is to be noted that like reference numerals denote parts equal to those in FIG. 5, thereby eliminating their detailed explanation.

This embodiment is obtained by improving the third embodiment and has a dual gate structure. That is, an $SiO_2$ film as the insulting film 18 is formed on the Si substrate 11, and a monocrystal SiGe layer (first gate electrode) 37, a monocrystal $CeO_2$ layer (first gate insulting film) 34 and a monocrystal strained-Si layer 31 are formed on the $SiO_2$ film. Here, the SiGe layer 37 functions as the first gate electrode, and the $CeO_2$ layer 34 functions as the first gate insulating film.

Further, like the third embodiment, a gate insulating film (second gate insulating film) 1 consisting of monocrystal $CeO_2$ and a gate electrode (second gate electrode) 17 consisting of monocrystal SiGe layer are formed on the Si layer 13, and the gate electrode 17 and the gate insulating film 14 are processed to have gate structures. A source area 25 and a drain area 26 are formed to the strained-silicon layer 13 so as to sandwich an area of the strained-silicon layer directly below the second gate electrode 17.

Furthermore, like the fourth embodiment, an interlayer insulating film 21 and wirings 22 are formed on the Si layer 13 and the gate electrode 17. Incidentally, although wirings for the first gate electrode 37 are not shown in the drawing, it is good enough to extend the first gate electrode 37 in the front and back sides of the drawing so that it is brought into contact with the dedicated wirings 22 at a part other than the transistor portion, for example.

As described above, in this embodiment, since there is adopted a dual gate structure that the gate electrodes are formed not only on the upper side of the monocrystal Si layer 13 which functions as the channel layer but also on the lower side of the same, it is possible to further precisely carry out control of carriers which move in the Si layer 13. Specifically, this structure is effective for the control over a threshold voltage which becomes more important in the conventional MOS structure transistor operation with realization of the minuteness of the transistor, and it is possible to achieve higher performances as compared with the conventional structure.

(Modification)

It is to be noted that the present invention is not restricted to the above-describe respective embodiments. Although SiGe is used as the relaxed buffer layer in this embodiment, it is possible to use a layer formed of B, As, P, Si, C, Ge, Ga, In, Al or a compound crystal layer of these materials. Specifically, SiC, SiGeC, GaAs, InP, InGaAlP or the like can be used.

Moreover, although $CeO_2$ is used as a monocrystal gate insulating film, it is possible to use a nitride including one element selected from the group consisting of Ge, Li, N, Si, Ti and U, or an oxide including one element selected from the group consisting of Am, Ce, Cm, K, Li, Na, Np, Pa, Po, Pu, Rb, Tb, Th, U, Zr and O, each in a rare earth structure having a $CaF_2$ structure.

Alternatively, it is possible to use a nitride including one element selected from the group consisting of Be, N, Ca, Cd, Mg, U and Zn, or an oxide including one element selected from the group consisting of Dy, Er, Eu, Gd, Ho, In, La, Lu, β-MnNd, Pr, Sc, Sm, Tb, Tl, Tm and Y, each in a rare earth structure having a C-rare earth structure.

Alternatively, it is possible to use an oxyfluoride including one element selected from the group consisting of Na, Ca, Nb, F, La, Ba, Sr and O, or an oxide including one element selected from the group consisting of Ca, Sb, Ta, Nb, Cd, Dy, Ru, Ti, Er, Sn, Gd, Ho, La, Zr, Hf, Pr, Sc, Sm, Tb, Tc, Tm, Y, Yb and Ce, each in a rare earth structure having a pyrochlore structure.

Alternatively, it is possible to use a halide including one element selected from the group consisting of Cs, Cr, K, F and O, an oxide including one element selected from the group consisting of Ag, I, Re, Ba, Mo, W, Bi, As, Ca, W, Cd, Ge, Hf, H, Re, Ru, N, H, Na, Tc, Pb, Rb, Sr, Th, Tl, U, Y, Nb and O, or a double oxide including one element selected from the group consisting of K, Bi, Mo, W, Li, La, Na, Ce, B, Ti, Er, Eu, Ho, Gd, Lu, Nd, Sm, Pr, Tb, Tm, Y and O, each in a rare earth structure having a $CaWO_4$ (scheelite) structure.

Most of all, $CeO_2$, $PrO_2$, $CaO_2$, $TbO_2$, $PrO_2$, $Dy_2O_3$, $Er_2O_3$, $Eu_2O_3$, $Gd_2O_3$, $Ho_2O_3$, $In_2O_3$, $La_2O_3$, $Lu_2O_3$, $Ld_2O_3$, $Pr_2O_3$, $Sm_2O_3$, $Tb_2O_3$, $Tl_2O_3$, $Tm_2O_3$, $Y_2O_3$ and $Yb_2O_3$ are desirable.

Additionally, a film thickness of each layer can be appropriately changed in accordance with a specification. For example, it is good enough to select a thickness of the SiGe layer as the buffer layer from a range of 30 to 500 nm. Likewise, it is good enough to select a thickness of the strained-Si layer as the channel from a range of 5 to 50 nm, a thickness of the $CeO_2$ film as the gate insulating film from a range of 0.5 to 10 nm, and the gate electrode from a range of 50 nm to 2 μm.

As described above in detail, according to the present embodiments, in the structure using the strained-Si channel layer, using a monocrystal rare earth oxide such as $CeO_2$ as the gate insulating film can suppress a deterioration in film quality of the gate insulating film involved by realization of minuteness or an increase in leakage current, thereby further improving the element characteristic.

Furthermore, the problems of the channel and the insulating film which are an obstacle of realization of high performances of the MOSFET can be solved at the same time, and the high-performance and low-consumption power transistor can be realized by accompanying the SOI. Moreover, since the MOS structure can be formed at a time by crystal growth, a reduction in cost as well as an application as a damascene process can be enabled, both a great reduction in manufacturing processes and realization of high performances can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
   a substrate;
   an insulating film formed on the substrate;
   a first gate electrode made of a first monocrystal semiconductor material formed on the insulating film;
   a first gate insulating film made of a first monocrystal rare earth oxide and formed on the first gate electrode;
   a monocrystal strained Si layer formed on the first gate insulating film to be in contact with the first gate insulating film;
   a second gate insulating film made of a second monocrystal rare earth oxide and formed at a position opposed to the first gate insulating film on the monocrystal strained Si layer to be in contact with the monocrystal strained Si layer; and
   a second gate electrode made of a second monocrystal semiconductor material and formed on the second gate insulating film.

2. The semiconductor apparatus according to claim 1, wherein the first gate electrode and the second gate electrode are made of a crystalline semiconductor material.

3. The semiconductor apparatus according to claim 1, wherein the first gate electrode and the second gate electrode are made of crystalline SiGe.

4. The semiconductor apparatus according to claim 1, wherein each of the first gate insulating film and the second gate insulating film is a monocrystal film including one selected from the group consisting of $CeO_2$, $PrO_2$, $CaO_2$, $TbO_2$, $PrO_2$, $Dy_2O_3$, $Er_2O_3$, $Eu_2O_3$, $Gd_2O_3$, $Ho_2O_3$, $In_2O_3$, $La_2O_3$, $Lu_2O_3$, $Nd_2O_3$, $Pr_2O_3$, $Sm_2O_3$, $Tb_2O_3$, $Tl_2O_3$, $Tm_2O_3$, $Y_2O_3$ and $Yb_2O_3$.

5. The semiconductor apparatus according to claim 1, wherein each of the first monocrystal semiconductor material and the second monocrystal semiconductor material includes SiGe.

6. The semiconductor apparatus according to claim 1, wherein each of the first semiconductor material and the second semiconductor material is formed on the silicon substrate through the insulating film.

7. The semiconductor apparatus according to claim 1, wherein, at both end portions in a direction of a gate length, the monocrystal strained Si layer is formed to extend above the substrate insulatively in an outer direction away from the first gate insulating film, and a source region and a drain region are formed in elongated portions of the monocrystal strained Si layer so as to sandwich a region of the monocrystal strained Si layer below the gate electrode.

* * * * *